Oct. 5, 1965 J. I. RHODES 3,210,681
BANDPASS AMPLIFIER WITH TRANSISTORIZED ISOLATION STAGE
Filed Oct. 12, 1962
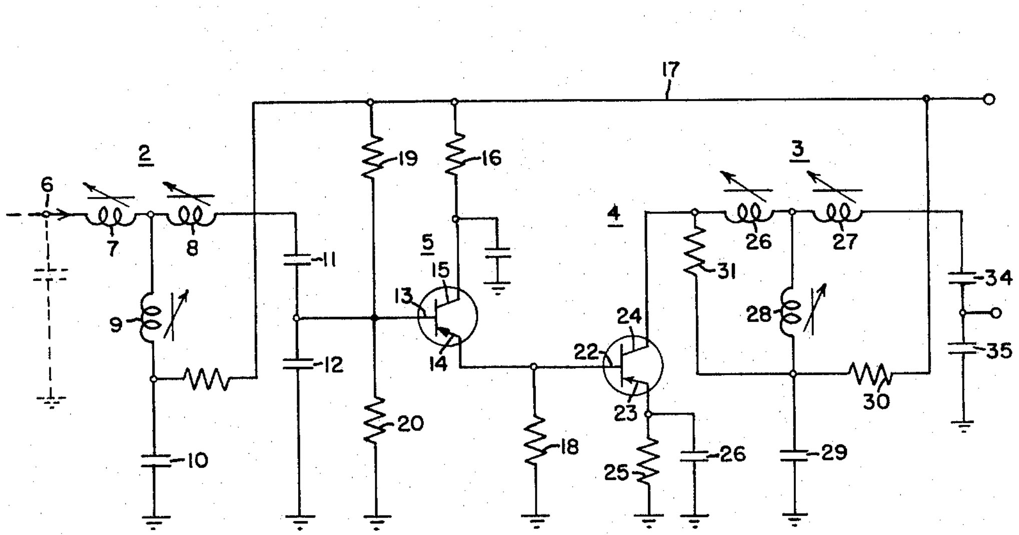
INVENTOR:
JUNIOR I. RHODES,
BY I. David Blumenfeld
HIS ATTORNEY.

United States Patent Office 3,210,681
Patented Oct. 5, 1965

3,210,681

BANDPASS AMPLIFIER WITH TRANSISTORIZED ISOLATION STAGE

Junior I. Rhodes, Lynchburg, Va., assignor to General Electric Company, a corporation of New York Filed Oct. 12, 1962, Ser. No. 230,047
4 Claims. (Cl. 330—32)

This invention relates to a solid state amplifier. More particularly, it relates to a bandpass, high frequency, tuned transistor amplifier circuit wherein interaction of the amplifier frequency selective networks is minimized.

Transistors, unlike vacuum tubes, are inherently bilateral conducting devices. In all transistor configurations, i.e., common emitter, common base, and common collector, if excitation is applied to the output terminals, a response or change in condition takes place at the input terminals. It follows, therefore, that all transistor devices have internal feedback to a greater or lesser degree. This internal feedback is undesirable under most circumstances and usually manifests itself as two inter-related effects.

First, internal feedback may, under certain circumstances, present serious stability problems in tuned, bandpass amplifiers. That is, the feedback signal may be of sufficient magnitude and may be so shifted in phase that the circuit oscillates. Tuned high frequency amplifiers having frequency selective input and output networks are particularly susceptible to such instabilities and may, quite often, become tuned-input, tuned-output oscillators. One of the standard techniques for minimizing the effect of internal feedback and thereby improving the stability of a transistor amplifier is to mismatch both the input and output terminations of the transistor amplifier. That is, if the generator impedance $Z_G$ seen by the input of the transistor is different from the transistor input impedance $Z_I$, and the load impedance $Z_L$ is different from the transistor output impedance $Z_O$, the feedback is reduced sufficiently to prevent oscillation. Thus, an increase in stability of the amplifier is exchanged for a reduction in gain.

In addition to mismatching the amplifier, another orthodox technique for reducing or cancelling internal feedback is by "neutralization" or, as it is sometimes referred to, "unilateralization." By means of this technique, an external feedback path is established around the transistor to apply external feedback having a magnitude and phase such as to cancel the internal feedback signal. The composite arrangement is therefore without any internal feedback, or in other words, the device is unilaterally conductive. However, the stability problem is not the only one raised by the internal feedback characteristics of transistors. Internal feedback produces a second undesirable effect which introduces great difficulties in the design and operation of high frequency, bandpass transistor amplifiers. This further effect is due to reflected circuit impedances or admittances. It can be shown that a transistor driven by a source having an impedance $Z_G$ and working into a load having an admittance $Y_L$, has an input impedance $Z_I$, in terms of its $h$ parameters, which is defined by the following equation:

$$Z_I = h_{11} - h_{12}h_{21}/(h_{22} + Y_L) \qquad (1)$$

and an output admittance $Y_O$ defined by the equation:

$$Y_O = h_{22} - h_{12}h_{21}/(h_{11} + Z_G) \qquad (2)$$

where $Z_I$=the input impedance of the transistor
$Y_O$=the output admittance of the transistor
$Y_L$=the load admittance
$Z_G$=the impedance of the source
$h_{11}$=the input impedance of the transistor in ohms with the output shorted
$h_{12}$=the reverse voltage ratio with the input open circuited
$h_{21}$=the forward current transfer ratio
$h_{22}$=the output admittance with the input open circuited.

As may be seen from Equations 1 and 2, the terms $$\frac{-h_{12}h_{21}}{(h_{22}+Y_L)}$$

and $-h_{12}h_{21}/(h_{11}+Z_G)$ are the reflected components of the input impedance and the output admittance respectively, since $h_{12}$ which represents the voltage feedback factor is not equal to zero. These reflected impedance components introduce a great many difficulties in designing and operating bandpass, high frequency, transistor amplifiers. Thus, for example, the magnitudes and characteristics of these reflected impedance components are frequency sensitive, particularly at the higher frequencies, and may cause deleterious interaction between the input and output frequency selective circuits, detuning these circuits and generally distorting the operating characteristics across the pass band of the amplifier. The problem of aligning one tuned amplifier in a circuit having a plurality of such amplifiers becomes very complicated indeed since the adjustment and aligning of one of the frequency sensitive circuits produces an interaction with the preceding and the following tuned circuits, thus requiring a very lengthy and tedious aligning procedure. For a further and more detailed discussion of the problem of reflected impedances as applicable to bandpass, high frequency transistor amplifiers, reference is hereby made to Transistor Circuit Engineering, edited by R. F. Shea (1957), John Wiley & Sons, Inc., New York, and particularly pages 184–196.

The unilateralizing compensation techniques of mismatching and in neutralizing discussed previously with respect to the stability problems of transistor amplifiers are partially effective in overcoming the effects of reflected impedances. However, the effectiveness of these techniques leaves much to be desired, particularly where bandpass high frequency amplifiers are concerned. Thus, the neutralizing technique is of very little use in the case of a bandpass amplifier having a pass band in the order of 10–20 mc. since the neutralizing network is not effective over the entire band, thus distorting the bandpass characteristics in all but a small portion of the pass band. In other words, neutralization techniques are effective to overcome the effects of reflected impedance only for narrow band amplifiers and are of very little use in wide band amplifiers. For narrow band amplifiers, adjustable circuit elements are both space consuming and expensive. For critical applications a fixed element is inadequate to cope with varying circuit parameters. A need, therefore, exists for a circuit arrangement useful with bandpass transistor amplifiers whereby the input and output selective circuits of the amplifier stage may be effectively isolated one from the other to prevent deleterious interaction between these network components.

It is one of the principal objectives of this invention, therefore, to provide a high frequency, bandpass transistor amplifier which utilizes an active isolating element to prevent interaction between the selective network components of the amplifier;

Another objective of the invention is to provide a high frequency, bandpass, tuned transistor amplifier which utilizes more than a single transistor per amplifying stage and wherein one of said transistors functions as an active isolating element;

Further objectives and advantages of the invention will become apparent as the description thereof proceeds.

The various advantages and objectives of the invention are realized in one embodiment of the invention by providing at least two transistor elements coupled between input and output selective networks of an amplifying stage. One of the transistor devices is connected in a common collector or "emitter-follower" connection and together with its associated circuit provides the desired isolation between the input selective network and the remaining transistor and the output selective network over a wide range of frequencies.

The novel features which are characteristic of this invention are set forth with particularity in the appended claims. The invention itself, however, both as to its organization and method of operation, together with other objectives and advantages thereof, may best be understood by reference to the following description taken in connection with the accompanying drawing in which:

The sole figure is a schematic circuit diagram of the transistor amplifier illustrating the instant invention.

The amplifier circuit, as shown in the sole figure, includes two frequency selective networks 2 and 3, a transistor amplifier stage 4 having a PNP transistor connected in the common emitter configuration coupled to selective network 3, and an active isolating element 5 coupled between frequency selective circuit 2 and common emitter amplifier 4. The active isolating element is in the form of a PNP transistor connected in the common collector or "emitter-follower" configuration. Emitter-follower 5 isolates impedance variations so that changes in the frequency selective circuit 2 have no effect on frequency selective network 3 and conversely variations in frequency selective network 3 are not reflected back into the selective network 2.

Frequency selective network 2 is shown as the input circuit for the amplifier and is provided with an input connection 6 which may be coupled to a preceding stage and which has the input signal impressed thereon. The input selective network 2 is essentially a double tuned resonant circuit and includes two variable inductive elements 7 and 8 and a variable common inductive element 9 coupled between the junction of inductors 7 and 8 and ground through a decoupling capacitor 10. Inductors 8 and 9 are tuned by means of the capacitors 11 and 12 whereas inductors 7 and 9 may be tuned by the capacitance of the previous stage, not shown, or the distributed capacitance existing between input terminal 6 and ground.

Capacitors 11 and 12 in addition to resonating inductors 8 and 9 also act as an impedance dividing network. That is, the impedance seen by the emitter-follower 5 whose base is connected to the junction of capacitors 11 and 12 is substantially reduced by virtue of the fact that the impedance seen by the transistor, i.e., the generator impedance $Z_G$, is not the high impedance of the network 2 but the impedance of the transformation which is quite low at a high input frequency. Thus, it may be seen that, contrary to normal usage, emitter-follower isolating stage 5 is working from a low impedance source.

Emitter-follower 5 includes a base electrode 13 coupled to the junction of capacitors 11 and 12, an emitter electrode 14 and a collector electrode 15. Collector 15 is connected through a suitable resistance 16 to a common bus 17 which is in turn connected to the negative terminal of a source of supply voltage. Emitter 14 is connected to a point of reference potential such as ground through an emitter resistance 18. Biasing for emitter-follower 5 is established by the voltage dividing resistance network comprising resistances 19 and 20 connected in series between the common bus 17 and ground, base electrode 13 being connected to the junction of these resistances.

The common emitter amplifier stage 4 which is coupled to "emitter-follower" 5 consists of a PNP transistor having having a base electrode 22, an emitter 23 and a collector 24. Emitter 23 is connected to ground through emitter resistance 25 which is bypassed for A.C. by a suitable bypass capacitor 26. Collector 24 is coupled to the output selective network 3 which is a doubly tuned resonant circuit consisting of two series connected inductors 26 and 27 and a common inductor 28. The common inductor 28 is connected between the junction of inductor 26 and 27 and a decoupling capacitor 29 which in conjunction with resistance 30 forms a decoupling network between the common bus of the supply voltage and the output selective network 3.

A further resistance element 31 is connected between collector 24 of the common emitter circuit and the junction of inductor 28 and capacitance 29. Resistance 31 functions as a mismatching impedance of a magnitude such that it presents a mismatch between the admittance $Y_L$ of the output load, i.e., the admittance of the selective network 3, and the output admittance $Y_O$ of transistor stage 4. The amplifier stage and the load are thus mismatched thereby reducing, in part, the reflected impedance. This mismatch, as was pointed out previously, is a standard technique for reducing the internal feedback and may or may not be used in conjunction with the active isolating stage consisting of emitter-follower stage 4.

Inductors 26 and 28 are tuned to the desired frequency by the distributed capacitance existing across these inductors. It will be obvious, however, that fixed capacitors may be utilized to resonate these inductors. Inductors 27 and 28 are tuned by means of the series connected capacitors 34 and 35 connected between inductor 27 and ground. The junction of capacitors 34 and 35 represents the output terminal of the amplifier stage and may be connected to the base electrode of the emitter-follower in the following stage.

The emitter-follower isolating stage 5 which is coupled between the common-emitter stage 4 and the input frequency selective circuit 2 functions to isolate the output selective circuit from the input selective circuit, and conversely. Thus, any changes in the output selective circuit will not detune the input selective circuit and vice versa. The manner in which the emitter-follower stage 5 functions to achieve this highly desirable result may best be understood as follows:

The approximate output impedance $R_O$ of an emitter-follower such as stage 5 is defined approximately by the equation:

$$R_0 \cong R_e + \frac{R_G + R_B}{1+\beta} \quad (3)$$

where $R_O$=the output impedance of the transistor $R_E$=the emitter series resistance which is customarily defined as $$R_E \doteq \frac{26}{I_E}$$

ohms, where $I_E$=emitter bias direct current in milliamperes $R_B$=the base spreading resistance of the transistor $R_G$=the source or generator impedance Beta ($\beta$)=the high frequency collector-base current transfer ratio.

When the high frequency beta ($\beta$) for an "emitter-follower" is greater than 1, it follows that the output impedance of the "emitter-follower" is less than the generator impedance seen by the transistor approximately by at least the factor beta ($\beta$). In typical commercially available transistors, the high frequency beta ($\beta$) may be equal to 10, for example, and hence variations in the load source $R_G$ are reduced at least by this factor.

As pointed out previously, the impedance of input selective network 2 seen by the emitter-follower 5 is already quite low by virtue of the impedance dividing actions of the series connected capacitances 11 and 12. This low generator impedance $R_G$ is further divided by the high frequency beta ($\beta$) of the transistor so that output impedance $R_O$ as seen by the emitter-follower stage 4 varies very little with changes in the network and is essentially determined by the emitter resistance $R_E$ and the base spreading resistance of the emitter-follower. As may be seen from Equation 3, any changes in the input selective circuit 2 (i.e., $R_G$) do not produce any great changes in the term $$\frac{R_G+R_B}{1+\beta}$$

so that these variations are substantially isolated from the input of the common emitter stage 4. Hence, changes in the input selective network 2 have substantially no effect on the output selective network 3 since substantially no change of impedance is reflected into that network.

Similarly, "emitter-follower" isolating stage 5 isolates the input selective network 2 from any changes in the selective network 3. The input impedance of the "emitter-follower" stage 5 may be defined by the equation $$R_I \cong (1+\beta)(R_L+R_E) \qquad (4)$$

where $R_I$=the input impedance of the emitter-follower

Beta ($\beta$)=the high frequency collector-base current transfer ratio $R_L$=the impedance of the load seen by the emitter-follower $R_E$=the resistance in the emitter of the transistor.

It can be seen therefore that any changes in load are multiplied by a factor of beta ($\beta$) thus changing the input impedance of the emitter-follower. Any change in the reflected impedance from output selective network is multiplied by beta ($\beta$). However, since the emitter-follower is already greatly mismatched with respect to the generator load presented by the input selective network 2, i.e., several orders of magnitude, the mismatch always remains substantial and the internal feedback and hence the reflected impedance between the selective networks of the amplifier stages are still minimized.

To sum up, in one direction the "emitter-follower" amplifier isolates any changes in the impedance by dividing down or reducing the reflected impedance transferred from input selective network 2 to output selective network 3. In the other direction, the same isolation is provided by virtue of the fact that any changes in the reflected impedance from selective network 3 and selective network 2 do not substantially affect the existing mismatch between the emitter-follower and selective network 2 thereby minimizing the effects of internal feedback and of reflected impedance.

A typical high frequency bandpass amplifier circuit embodying the instant invention was constructed with components having the following values, these values being cited by way of example only and are not to be considered as limiting the invention:

| | |
|---|---|
| Inductor **7** | Approximately 1 microhenry. |
| Inductor **8** | Approximately 1 microhenry. |
| Inductor **9** | Approximately 1 microhenry. |
| Capacitor **10** | 470 picofarads. |

| | |
|---|---|
| Capacitor **11** | 5 picofarads. |
| Capacitor **12** | 27 picofarads. |
| Transistor **5** | PNP 2N1742 Philco transistor. |
| Resistor **16** | 1K. |
| Emitter-resistance **18** | 6.2K. |
| Resistor **19** | 6.2K. |
| Resistor **20** | 7.5K. |
| Transistor **4** | 2N1742 Philco transistor. |
| Emitter-resistance **25** | 6.2K. |
| By-pass capacitor **26** | 470 picofarads. |
| Inductor **26** | Approximately 1 microhenry. |
| Inductor **27** | Approximately 1 microhenry. |
| Inductor **28** | Approximately 1 microhenry. |
| Capacitance **29** | 470 picofarads. |
| Mismatching resistance **31** | 1K. |
| Capacitor **34** | 5 picofarads. |
| Capacitor **35** | 27 picofarads. |

A circuit constructed with components having the above values was operated at 70 megacycles with half power output at 20 megacycle bandwidth, i.e., the amplifier stage had a bandwidth of 20 megacycles. A typical gain of 15 db was achieved with the above circuit with no measurable impedance interaction between frequency selective networks 2 and 3.

It will be apparent from the above description that a novel transistorized amplifier has been provided which is capable of high frequency wide band operation with substantial isolation between the frequency selective circuits of the amplifier stage. Furthermore, the desired isolation is achieved by means of an active solid stage device which is illustrated as being an emitter-follower stage coupled between the amplifier and the selective elements.

While a particular embodiment of this invention has been described and shown, it will, of course, be understood that it is not limited thereto, since many modifications and variations in the method and the circuit arrangement and in the instrumentalities for carrying out the invention may be made. It is contemplated by the appended claims to cover any such modifications as fall within the true spirit and scope of this invention.

What is claimed as new and desired to be secured by Letters Patent is:

1. A solid state bandpass amplifier comprising:

(1) a low impedance input selective network;

(2) an output selective network, both of said networks being selective over the same band of frequencies;

(3) a transistor amplifying stage connected in a configuration having a high input impedance, the output of said amplifying stage being coupled to said output network;

(4) a transistor isolating stage connected in the common collector configuration and having its input coupled to the low impedance network and its output to the input of said amplifying stage, said isolating stage thus operating between a low input impedance and a high output impedance and its input impedance being substantially greater than the nominal impedance of said input network so that a substantial impedance mismatch exists whereby variations in the impedance of said output network have negligible effect on the existing mismatch and on said input network, said transistor isolating stage also reducing the impedance variation of the input network in proportion to the beta of said transistor whereby impedance variations of said input network have negligible effect on said output network and prevent interaction between said networks due to reflected impedances.

2. A solid state bandpass amplifier, according to claim 1, wherein said transistor amplifying stage is connected in a common-emitter configuration.

3. A solid state bandpass amplifier, according to claim 1, wherein said input and output selective networks include a double tuned resonant circuit.

4. A solid state bandpass amplifier, according to claim 3, wherein said input selective network includes a further impedance dividing network coupled to said double tuned resonant network.

References Cited by the Examiner

UNITED STATES PATENTS

| | | | |
|---|---|---|---|
| 2,894,126 | 7/59 | Horgan. | |
| 2,983,875 | 5/61 | Zechter | 330—21 |
| 3,061,792 | 10/62 | Ebbinge | 330—21 |

ROY LAKE, *Primary Examiner.*

NATHAN KAUFMAN, *Examiner.*